US009972750B2

(12) United States Patent
Herner et al.

(10) Patent No.: US 9,972,750 B2
(45) Date of Patent: May 15, 2018

(54) USE OF DIELECTRIC FILM TO REDUCE RESISTIVITY OF TRANSPARENT CONDUCTIVE OXIDE IN NANOWIRE LEDS

(71) Applicant: GLO AB, Lund (SE)

(72) Inventors: Scott Brad Herner, San Jose, CA (US); Daniel Bryce Thompson, Walnut Creek, CA (US)

(73) Assignee: GLO AB, Lund (SE)

( * ) Notice: Subject to any disclaimer, the term of this patent is extended or adjusted under 35 U.S.C. 154(b) by 0 days. days.

(21) Appl. No.: 14/566,317

(22) Filed: Dec. 10, 2014

(65) Prior Publication Data
US 2015/0171280 A1 Jun. 18, 2015

Related U.S. Application Data

(60) Provisional application No. 61/915,914, filed on Dec. 13, 2013.

(51) Int. Cl.
*H01L 33/42* (2010.01)
*H01L 33/24* (2010.01)
(Continued)

(52) U.S. Cl.
CPC ............. *H01L 33/42* (2013.01); *H01L 33/24* (2013.01); *B82Y 20/00* (2013.01); *B82Y 40/00* (2013.01);
(Continued)

(58) Field of Classification Search
None
See application file for complete search history.

(56) References Cited

U.S. PATENT DOCUMENTS 7,335,908 B2 2/2008 Samuelson et al.
7,396,696 B2 7/2008 Kim et al.
(Continued)

FOREIGN PATENT DOCUMENTS

JP 2005-191220 7/2005
JP 2009-193975 8/2009
(Continued)

OTHER PUBLICATIONS

Deshmukh et al. Low-temperature plasma enhanced chemical vapor deposition of SiO2. Dec. 19, 1994. Applied Physics Letters. vol. 65. No. 25. pp. 3185-3187.*
(Continued)

*Primary Examiner* — Hoang-Quan Ho
(74) *Attorney, Agent, or Firm* — The Marbury Law Group PLLC

(57) ABSTRACT

Various embodiments include methods of fabricating light emitting diode (LED) devices, such as nanowire LED devices, that include forming a layer of a transparent, electrically conductive material over at least a portion of a non-planar surface of an LED device, and depositing a layer of a dielectric material over at least a portion of the layer of transparent conductive material, wherein depositing the layer of dielectric material comprises at least one of: (a) depositing the layer using a chemical vapor deposition (CVD) process, (b) depositing the layer at a temperature of 200° C. or more, and (c) depositing the layer using one or more chemically active precursors for the dielectric material.

21 Claims, 7 Drawing Sheets

(51) Int. Cl.
  *B82Y 20/00*  (2011.01)
  *B82Y 40/00*  (2011.01)
(52) U.S. Cl.
  CPC ... *H01L 2933/0016* (2013.01); *Y10S 977/762* (2013.01); *Y10S 977/891* (2013.01); *Y10S 977/95* (2013.01)

(56) References Cited

U.S. PATENT DOCUMENTS

| | | |
|---|---|---|
| 7,829,443 B2 | 11/2010 | Seifert et al. |
| 9,076,945 B2 * | 7/2015 | Herner ................. H01L 33/0095 |
| 9,178,106 B2 * | 11/2015 | Herner ................. H01L 33/0095 |
| 9,287,446 B2 * | 3/2016 | Yoo ......................... B82Y 20/00 |
| 9,799,796 B2 * | 10/2017 | Herner .................... H01L 33/06 |
| 2008/0179605 A1 * | 7/2008 | Takase .................... H01L 33/32 257/94 |
| 2011/0254034 A1 * | 10/2011 | Konsek .................. B82Y 20/00 257/98 |
| 2001/0309382 | 12/2011 | Lowgren |
| 2011/0309382 A1 | 12/2011 | Lowgren et al. |
| 2012/0061660 A1 | 3/2012 | Lu et al. |
| 2012/0270345 A1 | 10/2012 | Samuelson et al. |
| 2013/0313583 A1 * | 11/2013 | Hwang ................... H01L 33/08 257/88 |
| 2013/0341658 A1 * | 12/2013 | Lee ......................... H01L 33/14 257/91 |
| 2014/0117307 A1 * | 5/2014 | Herner ................. H01L 33/0095 257/13 |
| 2014/0117401 A1 * | 5/2014 | Herner ................. H01L 33/0095 257/99 |
| 2014/0367638 A1 | 12/2014 | Herner |
| 2014/0370631 A1 * | 12/2014 | Thompson ............ H01L 33/005 438/34 |

FOREIGN PATENT DOCUMENTS

| | | |
|---|---|---|
| KR | 10-2009-0111810 A | 10/2009 |
| KR | 10-2012-0028104 A | 3/2012 |
| KR | 10-2013-0008306 | 1/2013 |
| TW | 200541390 A | 12/2005 |
| WO | WO 2007/102781 | 9/2007 |
| WO | WO 2008/048704 | 4/2008 |
| WO | WO 2010/014032 | 2/2010 |
| WO | WO 2011/162715 | 12/2011 |
| WO | WO 2014/151034 A1 | 9/2014 |

OTHER PUBLICATIONS

International Search Report for International Application No. PCT/US2014/024805, dated Aug. 7, 2014.
International Search Report and Written Opinion received in connection with international application No. PCT/US2014/069429, dated Apr. 23, 2015.
International Preliminary Report or Patentability and Written Opinion of the International Searching Authority for International Application No. PCT/US2014/069429, dated Jun. 23, 2016, 8 pages.
ROC Taiwanese Office Communication and Search Report for Taiwan Patent Application No. 102138763, dated Mar. 2, 2017, 9 pages.
ROC Taiwanese Office Communication and Search Report for Taiwan Patent Application No. 103143125, dated Dec. 15, 2017, 5 pages, including English-language translation of the Search Report.

* cited by examiner

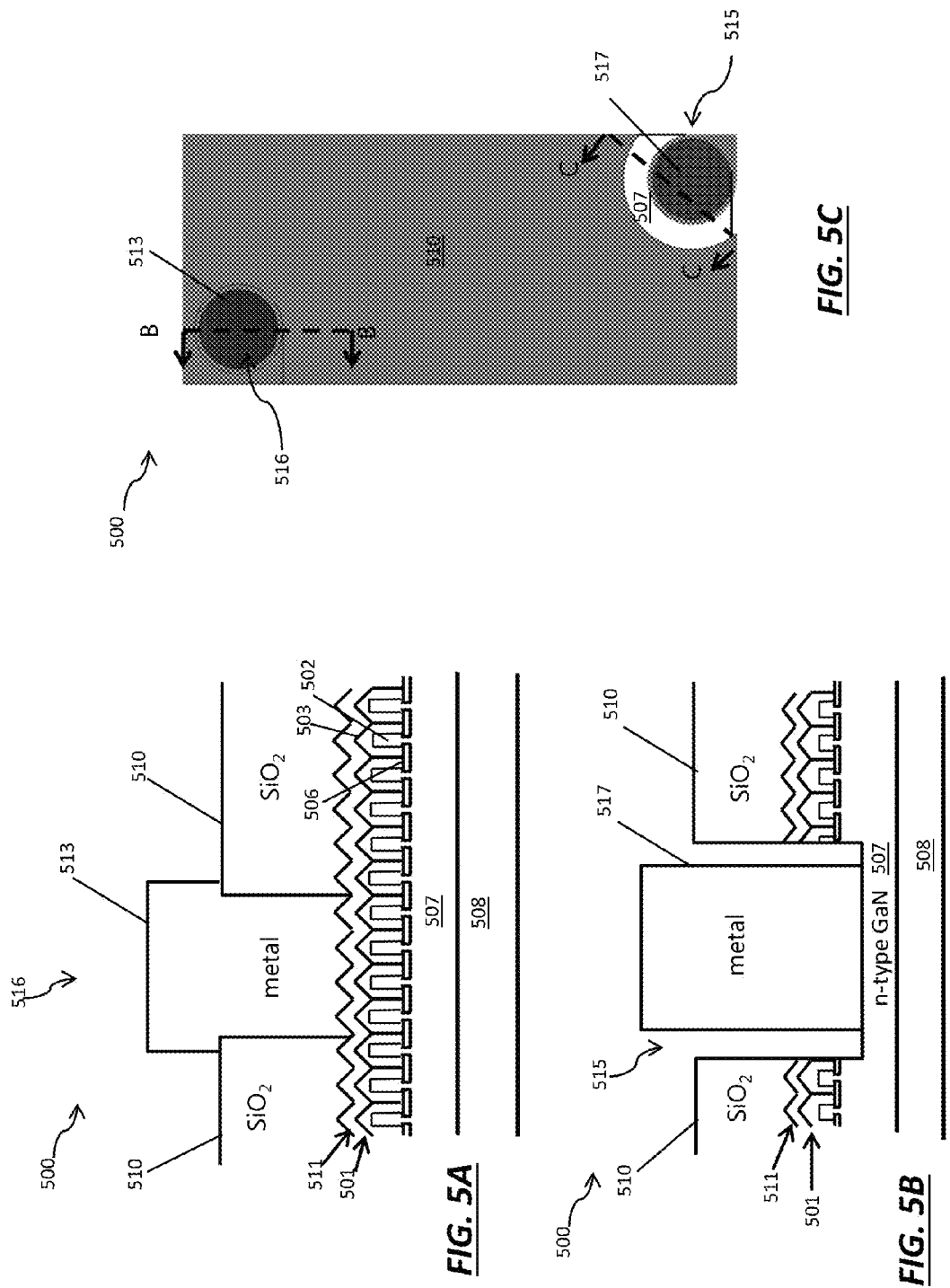

USE OF DIELECTRIC FILM TO REDUCE RESISTIVITY OF TRANSPARENT CONDUCTIVE OXIDE IN NANOWIRE LEDS

RELATED APPLICATION

This application claims benefit of U.S. Provisional Patent Application Ser. No. 61/915,914, filed Dec. 13, 2013, the entire content of which is incorporated herein by reference.

BACKGROUND

Nanowire light emitting diodes (LED) are of increasing interest as an alternative to planar LEDs. In comparison with LEDs produced with conventional planar technology, nanowire LEDs offer unique properties due to the three-dimensional nature of the nanowires, improved flexibility in materials combinations due to less lattice matching restrictions and opportunities for processing on larger substrates.

Despite the advantages of nanowire LEDs, further improvements in the light extraction efficiency of nanowire LEDs would be desirable.

SUMMARY

Embodiments include methods of fabricating a light emitting diode (LED) device, such as a nanowire LED device, that include forming a layer of a transparent, electrically conductive material over at least a portion of a non-planar surface of the LED device, and depositing a layer of a dielectric material over at least a portion of the layer of transparent conductive material, wherein depositing the layer of dielectric material comprises at least one of: (a) depositing the layer using a chemical vapor deposition (CVD) process, (b) depositing the layer at a temperature of 200° C. or more (e.g., 200° C. to 600° C.), and (c) depositing the layer using one or more chemically active precursors for the dielectric material.

In various embodiments, depositing a dielectric material layer over a transparent conductive material (e.g., electrode) layer may decrease the resistivity of the transparent conductive material layer, thereby minimizing or eliminating current crowding and improving the light extraction efficiency of non-planar LED devices, such as nanowire LED devices. In embodiments, the addition of the dielectric material layer over a transparent conductive material layer may decrease the resistivity of the transparent conductive material layer in the device to a value that is 50% or less of the resistivity of the transparent conductive material in the device without the dielectric material layer.

Further embodiments include light emitting diode (LED) devices, such as nanowire LED devices, fabricated in accordance with the embodiment methods.

BRIEF DESCRIPTION OF THE DRAWINGS

The accompanying drawings, which are incorporated herein and constitute part of this specification, illustrate example embodiments of the invention, and together with the general description given above and the detailed description given below, serve to explain the features of the invention.

FIG. 5A is a partial cross-section view of a nanowire LED device having a layer of dielectric material over a transparent conductive oxide (TCO) layer according to an embodiment.

FIG. 5B is a partial cross-section view of the nanowire LED device of FIG. 5A illustrating an n-metal contact.

FIG. 5C is an overhead view of the nanowire LED device of FIG. 5A.

DETAILED DESCRIPTION

Figure 1:
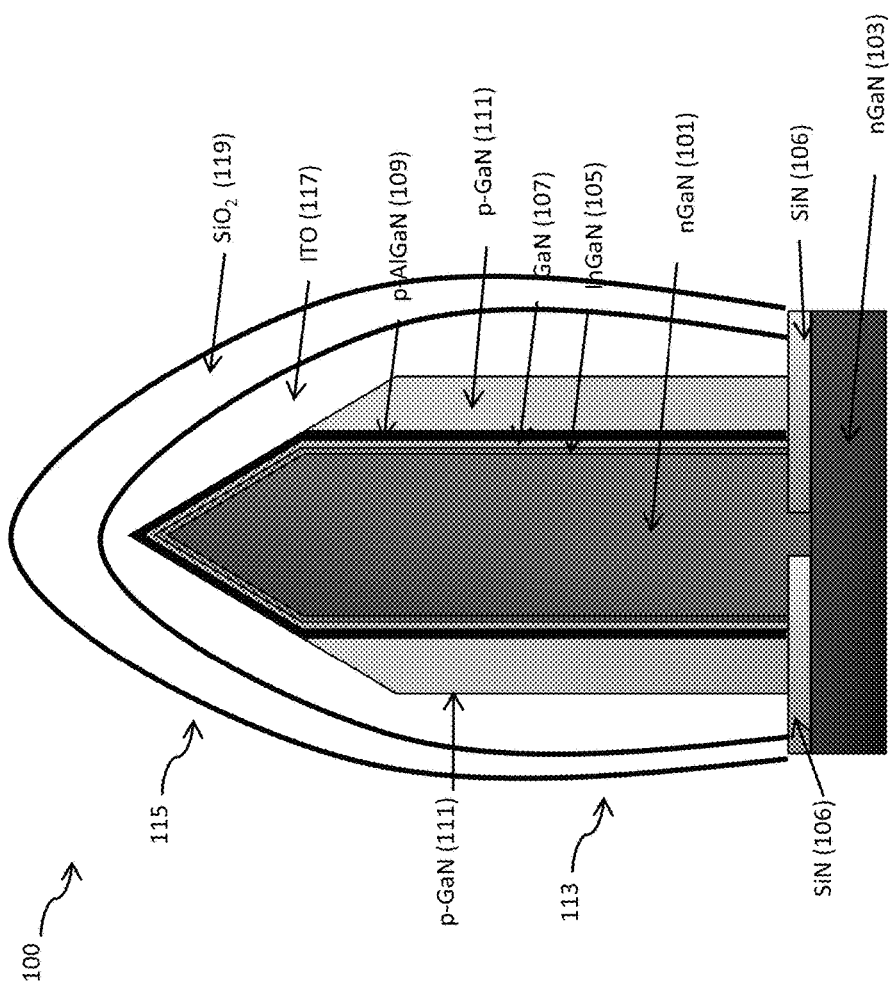
FIG. 1 schematically illustrates a side cross sectional view of a nanowire LED having a layer of dielectric material over a transparent conductive oxide (TCO) layer according to an embodiment.

The various embodiments will be described in detail with reference to the accompanying drawings. Wherever possible, the same reference numbers will be used throughout the drawings to refer to the same or like parts. References made to particular examples and implementations are for illustrative purposes, and are not intended to limit the scope of the invention or the claims.

Embodiments of the invention include nanowire-based semiconductor devices, such as nanowire LEDs, and methods of fabricating nanowire LEDs, with reduced current crowding and improved light extraction efficiency. Nanowire LEDs, such as GaN nanowire LEDs, show promise in increasing the efficiency and wavelength stability compared to conventional planar LEDs. However, the light extraction efficiency of such devices may not be optimal due to the relatively high resistivity of the transparent conductive oxide (TCO) material electrodes which may result in current crowding and decreased efficiency.

Various embodiments include an LED device having a layer of a transparent conductive material over at least a portion of a non-planar surface of the LED device and a layer of a dielectric material over a least a portion of the layer of the transparent conductive material. The LED device may comprise a nanowire LED array, and the non-planar surface of the LED device may comprise the upper surface of an array of nanowires arranged generally normal (e.g., within 60° of normal) to a surface of a support substrate. The dielectric material may have a resistivity that is greater than $10^2$ times (e.g., greater than $10^{10}$ times, such as greater than $10^{14}$ times, including $10^3$ to $10^{15}$ times) the resistivity of the transparent conductive material. The transparent conductive material may be a transparent conductive oxide (TCO), such as indium tin oxide (ITO). The dielectric material may be $SiO_2$, $SiN$ and/or $Al_2O_3$, for example. In embodiments, the layer of dielectric material may be deposited over the layer of transparent conductive material by chemical vapor deposition (CVD). In embodiments, the layer of dielectric material may be deposited over the layer of transparent conductive material at an elevated temperature (e.g. 200° C. or more, such as 200° C.-600° C.). In embodiments, the layer of dielectric material may be deposited over the layer of transparent conductive material using one or more chemically active precursors for the dielectric material.

The layer of dielectric material may have a high transmissivity (e.g., greater than 85%, such as greater than 90% or 95%) for at least one emission wavelength of the LED device, which may be a visible, infrared (IR) or ultraviolet (UV) wavelength. In one embodiment, the at least one emission wavelength of LED device may be a visible wavelength, such as between 390-700 nm (e.g., 450-550 nm). The addition of a dielectric material layer over a transparent conductive material (e.g., electrode) layer may decrease the resistivity of the transparent conductive material layer, thereby minimizing or eliminating current crowding and improving the light extraction efficiency of non-planar LED devices, such as nanowire LED devices, including GaN nanowire LED devices. In embodiments, the addition of the dielectric material layer over a transparent conductive material layer may decrease the resistivity of the transparent conductive material layer in the device to a value that is 50% or less (e.g., 10-50%) of the resistivity of the transparent conductive material in the device without the dielectric material layer.

In the art of nanotechnology, nanowires are usually interpreted as nanostructures having a lateral size (e.g., diameter for cylindrical nanowires or width for pyramidal or hexagonal nanowires) of nano-scale or nanometer dimensions, whereas its longitudinal size is unconstrained. Such nanostructures are commonly also referred to as nanowhiskers, one-dimensional nano-elements, nanorods, nanotubes, etc. The nanowires can have a diameter or width of up to about 2 micron. The small size of the nanowires provides unique physical, optical and electronic properties. These properties can for example be used to form devices utilizing quantum mechanical effects (e.g., using quantum wires) or to form heterostructures of compositionally different materials that usually cannot be combined due to large lattice mismatch. As the term nanowire implies, the one dimensional nature may be associated with an elongated shape. Since nanowires may have various cross-sectional shapes, the diameter is intended to refer to the effective diameter. By effective diameter, it is meant the average of the major and minor axis of the cross-section of the structure. Although in the figures the nano elements are shown to be pillar-like and based on nanowire cores, it should be noted that the cores can also have other geometries such as pyramids with various polygonal bases, such as square, hexagonal, octagonal, etc. Thus, as used herein, the core may comprise any suitable element having a width or diameter of less than 2 microns and a length greater than 1 micron and may comprise a single structure or a multi-component structure. For example, the core may comprise a semiconductor nanowire of one conductivity type or it may comprise the semiconductor nanowire of one conductivity type surrounded by one or more semiconductor shells of the same conductivity type and the core having a pillar or pyramid shape. For simplicity, a single component nanowire pillar core will be described below and illustrated in the figures.

All references to upper, top, lower, downwards etc. are made as considering the substrate being at the bottom and the nanowires extending upwards from the substrate. Vertical refers to a direction perpendicular to the plane formed by the substrate, and horizontal to a direction parallel to the plane formed by the substrate. This nomenclature is introduced for the easy of understanding only, and should not be considered as limiting to specific assembly orientation etc.

In embodiment methods, a layer of an optically transmissive dielectric material (e.g., $SiO_2$, SiN, $Al_2O_3$, etc.) may formed over at least a portion of a layer of transparent conductive material on a non-planar surface of an LED device, such as a nanowire LED. The dielectric material layer may be formed by chemical vapor deposition (CVD) or another process at elevated temperature (e.g., 200° C. to 600° C., such as 200° C. to about 510° C.) and/or involving chemically active precursor(s) for the dielectric material. The addition of a dielectric material layer may reduce the resistivity of the transparent conductive material, thus reducing current crowding and improving the efficiency of the LED device.

Any suitable LED device, such as a nanowire LED structure as known in the art may be used in the methods of the invention.

An example nanowire LED 100 according to one embodiment is illustrated in FIG. 1. In this example, a nanowire LED 100 includes an n-GaN core 101 in electrical contact with an n-GaN buffer layer 103, intermediate layers or shells of InGaN/GaN quantum well active region 105, 107, and p-AlGaN and p-GaN outer shells 109, 111, with a vertical sidewall 113 and a conical tip 115. In various embodiments, the conical tip may be partially or completely eliminated to provide a nanowire structure having a substantially flat surface at the tip end. A layer of electrical contact material 117 (ITO) is provided over the outer layer of p-GaN 111, and a layer of dielectric material 119 ($SiO_2$) is provided over the ITO layer 117. A dielectric or masking layer 106 (SiN) may be located between the p-GaN layer 111 and electrical contact material 117 (ITO) and the n-GaN buffer layer 103.

Nanowire LEDs are typically based on one or more pn- or p-i-n-junctions. The difference between a pn junction and a p-i-n-junction is that the latter has a wider active region. The wider active region allows for a higher probability of recombination in the i-region. Each nanowire comprises a first conductivity type (e.g., n-type) nanowire core and an enclosing second conductivity type (e.g., p-type) shell for forming a pn or pin junction that in operation provides an active region for light generation. While the first conductivity type of the core is described herein as an n-type semiconductor core and the second conductivity type shell is described herein as a p-type semiconductor shell, it should be understood that their conductivity types may be reversed.

Figure 2:
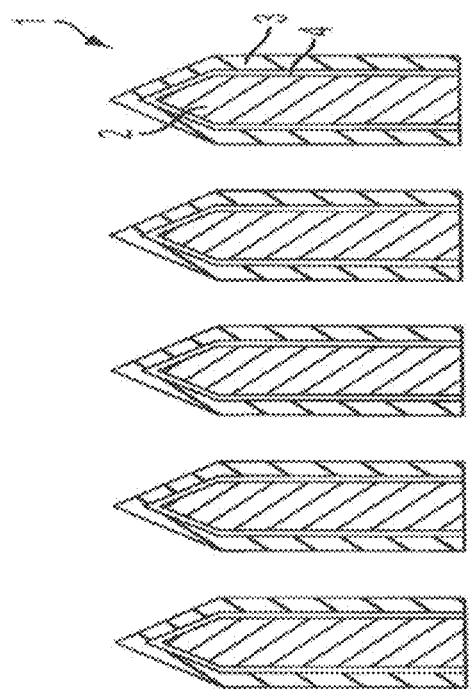
FIG. 2 schematically illustrates a side cross sectional view of a basis of a nanowire LED array in accordance with embodiments of the invention.

FIG. 2 schematically illustrates a nanowire LED structure that may be used in accordance with some embodiments of the invention. In principle, one single nanowire is enough for forming a nanowire LED, but due to the small size, nanowires are preferably arranged in arrays comprising hundreds, thousands, tens of thousands, or more, of nanowires side by side to form the LED structure. For illustrative purposes the individual nanowire LED devices will be described herein as being comprised of nanowires 1 having an n-type nanowire core 2 and a p-type shell 3 at least partly enclosing the nanowire core 2 and an intermediate active layer 4. However, for the purpose of embodiments of the invention nanowire LEDs are not limited to this. For example the nanowire core 2, the active layer 4 and the p-type shell 3 may be made up from a multitude of layers or segments. By controlling growth conditions the final geometry of a LED can range from elongated, narrow "pillar structures" to relatively wide based pyramid structures.

In alternative embodiments, only the core 2 may comprise a nanostructure or nanowire by having a width or diameter below 1 micron, while the shell 3 may have a width or diameter above one micron.

III-V semiconductors are of particular interest due to their properties facilitating high speed and low power electronics and optoelectric devices, such as LEDs and lasers. The nanowires can comprise any semiconductor material, and suitable materials for the nanowire include but are not limited to: GaAs (p), InAs, Ge, ZnO, InN, GaInN, GaN, AlGaInN, BN, InP, InAsP, GaInP, InGaP:Si, InGaP:Zn, GaInAs, AlInP, GaAlInP, GaAlInAsP, GaInSb, InSb, Si. Possible donor dopants for e.g. GaP are Si, Sn, Te, Se, S, etc, and acceptor dopants for the same material are Zn, Fe, Mg, Be, Cd, etc. It should be noted that the nanowire technology makes it possible to use nitrides such as GaN, InN and MN, which facilitates fabrication of LEDs emitting light in wavelength regions not easily accessible by conventional technique. Other combinations of particular commercial interest include, but are not limited to GaAs, GaInP, GaAlInP, GaP systems. Typical doping levels range from $10^{18}$ to $10^{20}$. A person skilled in the art is familiar with these and other materials and realizes that other materials and material combinations are possible.

Preferred materials for nanowire LEDs are III-V semiconductors such as a III-nitride semiconductor (e.g., GaN, AlInGaN, AlGaN and InGaN, etc.) or other semiconductors (e.g., InP, GaAs). In order to function as a LED, the n-side and p-side of each nanowire 1 has to be contacted, and the present invention provides methods and compositions related to contacting the n-side and the p-side of the nanowires in a LED structure.

Although the exemplary fabrication method described herein preferably utilizes a nanowire core to grow semiconductor shell layers on the cores to form a core-shell nanowire, as described for example in U.S. Pat. No. 7,829,443, to Seifert et al., incorporated herein by reference for the teaching of nanowire fabrication methods, it should be noted that the invention is not so limited. For example, in alternative embodiments, only the core may constitute the nanostructure (e.g., nanowire) while the shell may optionally have dimensions which are larger than typical nanowire shells. Furthermore, the device can be shaped to include many facets, and the area ratio between different types of facets may be controlled. This is exemplified in figures by the "pyramid" facets and the vertical sidewall facets. The LEDs can be fabricated so that the emission layer formed on templates with dominant pyramid facets or sidewall facets. The same is true for the contact layer, independent of the shape of the emission layer.

The use of sequential (e.g., shell) layers may result in the final individual device (e.g., a pn or pin device) having a shape anywhere between a pyramid shape (i.e., narrower at the top or tip and wider at the base) and pillar shaped (e.g., about the same width at the tip and base) with circular or hexagonal or other polygonal cross section perpendicular to the long axis of the device. Thus, the individual devices with the completed shells may have various sizes. For example, the sizes may vary, with base widths ranging from 100 nm to several (e.g., 5) μm, such as 100 nm to below 1 micron, and heights ranging from a few 100 nm to several (e.g., 10) μm.

Figure 3:
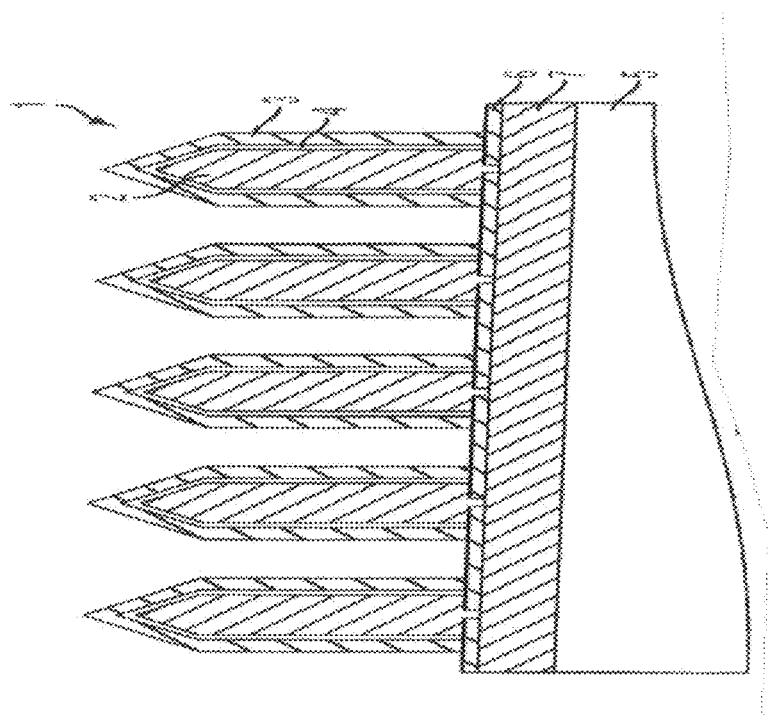
FIG. 3 schematically illustrates a side cross sectional view of a basis of a nanowire LED array on a buffer layer in accordance with embodiments of the invention.

FIG. 3 illustrates an exemplary structure that provides a support for the nanowires. By growing the nanowires 1 on a growth substrate 5, optionally using a growth mask, or a dielectric masking layer 6 (e.g., a nitride layer, such as silicon nitride dielectric masking layer) to define the position and determine the bottom interface area of the nanowires 1, the substrate 5 functions as a carrier for the nanowires 1 that protrude from the substrate 5, at least during processing. The bottom interface area of the nanowires comprises the area of the core 2 inside each opening in the dielectric masking layer 6. The substrate 5 may comprise different materials such as III-V or II-VI semiconductors, Si, Ge, $Al_2O_3$, SiC, Quartz, glass, etc., as discussed in Swedish patent application SE 1050700-2 (assigned to GLO AB), which is incorporated by reference herein in its entirety. Other suitable materials for the substrate include, but are not limited to: GaAs, GaP, GaP:Zn, GaAs, InAs, InP, GaN, GaSb, ZnO, InSb, SOI (silicon-on-insulator), CdS, ZnSe, CdTe. In one embodiment, the nanowires 1 are grown directly on the growth substrate 5.

In embodiments in which a dielectric masking (growth mask) layer is used, the growth mask 6 may be patterned by photolithography to define openings for the nanowire growth, as described for example in U.S. Pat. No. 7,829,443, incorporated herein by reference in its entirety. In this implementation, the nanowires are grouped in an n-pad area, a non-active area, a LED area (i.e., the area which emits light) and a p-pad area. However, embodiments of the invention are not limited to this. For example the p-pad area may be arranged on top of the nanowires forming the light emitting part of the nanowire LED structure, whereby the p-pad area and the LED area coincide, as described in PCT International Application Publication Number WO 2010/014032 A1 to Konsek, et al., published Feb. 4, 2010 and incorporated herein by reference in its entirety.

Preferably, the substrate 5 is also adapted to function as a current transport layer connecting to the n-side of each nanowire 1. This can be accomplished by having a substrate 5 that comprises a buffer layer 7 arranged on the surface of the substrate 5 facing the nanowires 1, as shown in FIG. 3, by way of example a III-nitride layer, such as a GaN and/or AlGaN buffer layer 7 on a Si substrate 5. The buffer layer 7 provides a structure for contacting the n-side of the nanowires 1. The buffer layer 7 is usually matched to the desired nanowire material, and thus functions as a growth template in the fabrication process. For an n-type core 2, the buffer layer 7 is preferably also doped n-type. The buffer layer 7 may comprise a single layer (e.g., GaN), several sublayers (e.g., GaN and AlGaN) or a graded layer which is graded from high Al content AlGaN to a lower Al content AlGaN or GaN. The nanowires can comprise any semiconductor material, but for nanowire LEDs III-V semiconductors such as a III-nitride semiconductor (e.g., GaN, AlInGaN, AlGaN and InGaN, etc.) or other semiconductors (e.g., InP, GaAs) are usually preferred. The growth of nanowires can be achieved by utilizing methods described in the U.S. Pat. Nos. 7,396,696, 7,335,908, and 7,829,443, and WO201014032, WO2008048704 and WO 2007102781, all of which are incorporated by reference in their entirety herein. It should be noted that the nanowire 1 may comprise several different materials (e.g., GaN core, GaN/InGaN active layer and InGaN shell having a different In to Ga ratio than the active layer). In general the substrate 5 and/or the buffer layer 7 are referred to herein as a support or a support layer for the nanowires. In certain embodiments, a conductive layer (e.g., a mirror or transparent contact) may be used as a support instead of or in addition to the substrate 5 and/or the buffer layer 7. Thus, the term "support layer" or "support" may include any one or more of these elements.

The above description of an exemplary embodiment of a LED structure will serve as a basis for the description of the methods and devices of the invention; however, it will be appreciated that any suitable nanowire LED structure or other suitable nanowire structure or LED structure may also be used in the methods and devices, with any necessary modifications as will be apparent to one of skill in the art, without departing from the invention.

Figure 4B:
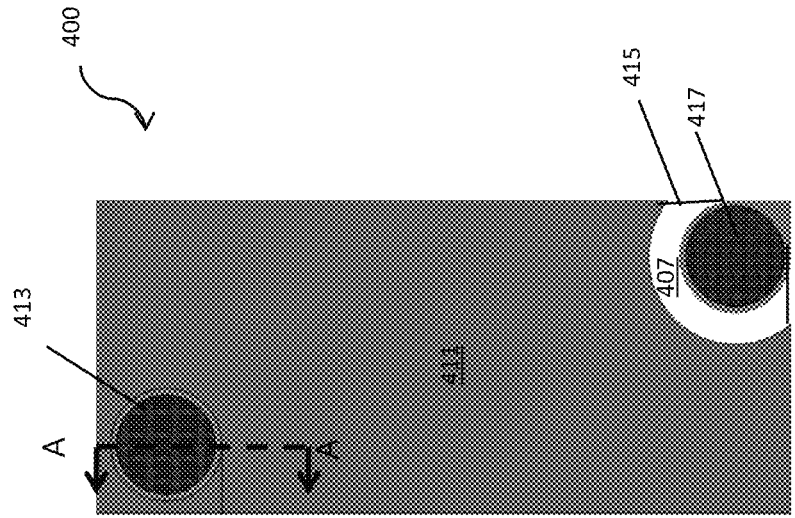
FIG. 4B is an overhead view of the prior art nanowire LED device of FIG. 4A.
Figure 4A:
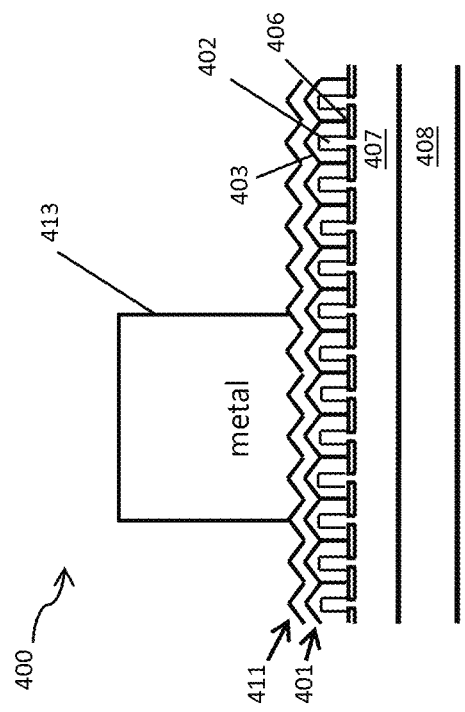
FIG. 4A is a partial cross-section view of a nanowire LED device of the prior art.

FIGS. 4A-D schematically illustrate a nanowire LED device 400 of the prior art. FIG. 4A is a partial cross-section view of the LED device 400, viewed along line A-A in the overhead view of FIG. 4B. The device 400 includes a nanowire array, such as shown above in FIG. 3, that includes a plurality of nanowires 401, such as tapered nanowires that are arranged on a support 408, where the nanowires 401 comprise a first conductivity type (e.g., n-type) semiconductor core 402 and a second conductivity type (e.g., p-type) shell 403 that are configured to form a pn or pin junction that in operation provides an active region for light generation (e.g., an intermediate active layer may also be added as shown in FIG. 3). The solid support may include a buffer layer 407 that is in electrical contact with the nanowire core 402, and a dielectric (e.g., SiN) masking layer 406 that insulates the nanowire shell 403 from the buffer layer 407, both of which may be provided on a bottom substrate layer 408. An optional intermediate layer (not shown) may also be provided on the support, and may comprise an undoped GaN layer to reduce the density of crystal defects in the nanowires.

A transparent conductive oxide (TCO) layer 411, such as an ITO layer, is deposited over the nanowire structure to make electrical contact with the outer shells 403 of the nanowires 401 and provide a p-electrode. A p-side metal contact 413 may be formed over the TCO layer 411, as shown in FIG. 4A. The n-type buffer layer 407 may be exposed in an n-side contact area 415 and an n-side metal contact 417 may be formed on the n-type buffer layer 407 in the n-side contact area 415.

Figure 4D:
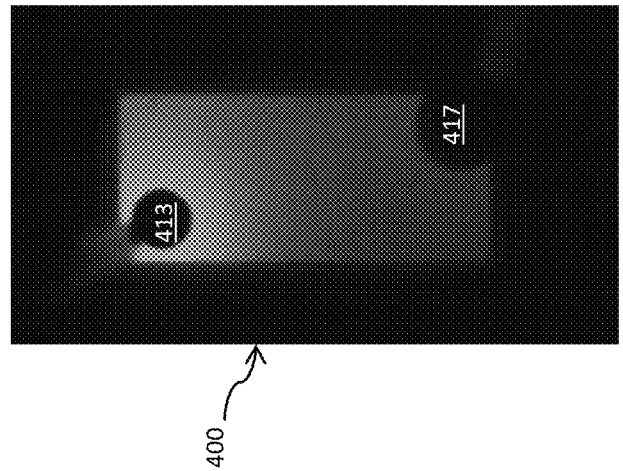
FIG. 4D is a photograph of a nanowire LED device fabricated in accordance with FIGS. 4A-B.
Figure 4C:
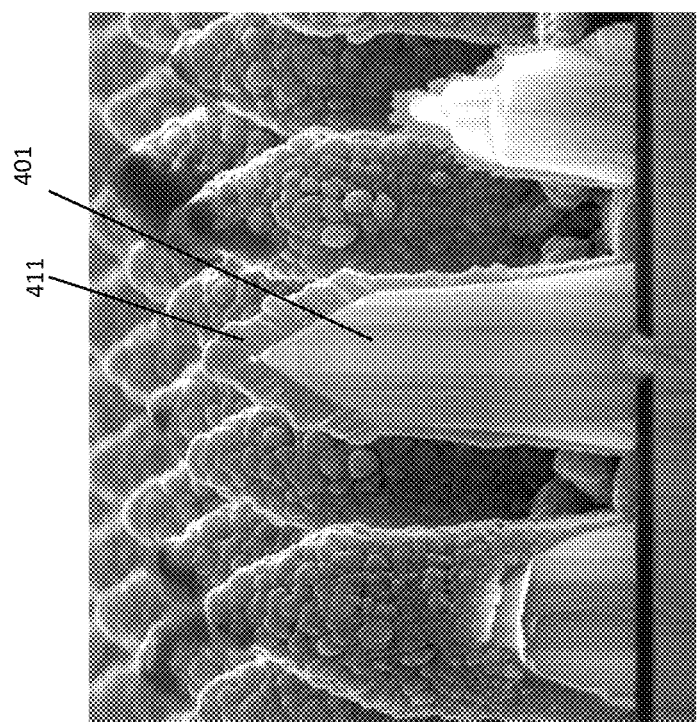
FIG. 4C is a cross-section SEM image of a nanowire LED device fabricated in accordance with FIGS. 4A-B.

Indium tin oxide (ITO) is commonly used as the transparent conductive oxide layer 411 for making contact to the second conductivity type (e.g., p-type) shell 403 of the nanowires 401. FIG. 4C is a SEM image of an ITO layer 411 over GaN nanowires 401. ITO has a relatively high resistivity of around 100-300 $\mu\Omega\cdot cm$ in thin film form, which compares to a resistivity of about 3 $\mu\Omega\cdot cm$ for thin films of aluminum. However, despite this relatively high resistivity, ITO is valued for its ability to be both electrically conductive and transparent to visible light.

The transparent conductive oxide (e.g., ITO) layer 411 is typically formed using physical vapor deposition (PVD), such as sputtering or evaporation. Physical vapor deposition of films like ITO will not result in the film being deposited with uniform thickness or density on non-planar surfaces, such as the surface formed by an array of vertically-aligned nanowires on a support substrate. For example, for nanowires extending from a planar surface (e.g., the surface of a semiconductor wafer or other support surface), the sidewalls of the nanowires will generally have a much thinner coating of physically deposited ITO than will the planar surfaces between the nanowires. In some cases, this inability to cover surfaces with high angles relative to the wafer surface leads to a high effective sheet resistance of the film averaged over the surface of the LED die. This high sheet resistance can lead to a phenomenon known as "current crowding," in which LED junctions (e.g., active regions between the nanowire cores 402 and the respective outer shells 403) located closer to the metal contact 413 on the ITO electrode layer 411 emit more light than LED junctions further away from the metal contact 413. This is illustrated in FIG. 4D, which is a photograph of an LED device 400 such as shown in FIGS. 4A-B. As can be seen in FIG. 4D, the LED device 400 emits more light proximate to the p-side metal contact 413 than proximate to the n-side metal contact 417. This is a result of the high series resistance of the ITO film that contacts the p-type GaN shells of the nanowires. Current crowding is undesirable, as it decreases the efficiency of the LED (i.e., there is decreased light output for a given electrical current provided to the device) and results in light emission in a spatially nonuniform pattern.

Various embodiments include a non-planar LED device, such as a nanowire LED device, having a layer of an optically transmissive dielectric material (e.g., $SiO_2$, SiN, $Al_2O_3$, etc.) formed over at least a portion of a transparent conductive oxide (TCO) material layer, such as an ITO layer. Applicants have discovered that deposition of a dielectric material layer at elevated temperature (e.g., 200° C. or more, such as 200° C. to 600° C., 200° C. to about 510° C.) and/or using chemically active precursor(s) for the dielectric material, such as using a chemical vapor deposition (CVD) process, over a physically deposited TCO material layer, may significantly reduce the resistivity of the TCO layer, thus minimizing or eliminating current crowding and improving LED device efficiency. The dielectric material layer may be transparent, enabling the LED device to function normally. Also, the dielectric material layer may serve as a passivating layer to the device, meaning that it may provide a protective barrier to mobile ions that could otherwise damage the device.

Figure 5E:
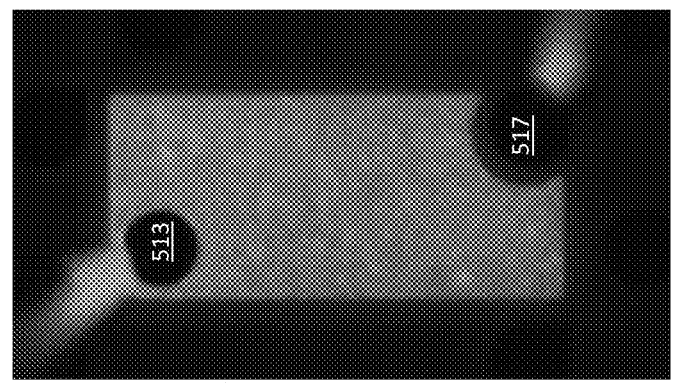
FIG. 5E is a photograph of a nanowire LED device fabricated in accordance with FIGS. 5A-C.

FIGS. 5A-E illustrate a nanowire LED device 500 according to an embodiment. FIG. 5A is a partial cross-section view of the LED device 500, viewed along line B-B in the overhead schematic view of FIG. 5C. FIG. 5B is a partial cross-section view of the LED device 500 viewed along line C-C in FIG. 5C. The device 500 may be similar to the device of FIGS. 4A-B, and may include a nanowire array that includes a plurality of nanowires 501, such as tapered nanowires that are arranged on a support 508, where the nanowires 501 comprise a first conductivity type (e.g., n-type) semiconductor core 502 and a second conductivity type (e.g., p-type) shell 503 that are configured to form a pn or pin junction that in operation provides an active region for light generation (e.g., an intermediate active layer may also be added as shown in FIG. 3). The solid support may include a buffer layer 507 that is in electrical contact with the nanowire core 502, and a dielectric (e.g., SiN) masking layer 506 that insulates the nanowire shell 503 from the buffer layer 507, both of which may be provided on a bottom substrate layer 508. An optional intermediate layer (not shown) may also be provided on the support, and may comprise an undoped GaN layer to reduce the density of crystal defects in the nanowires.

Figure 5D:
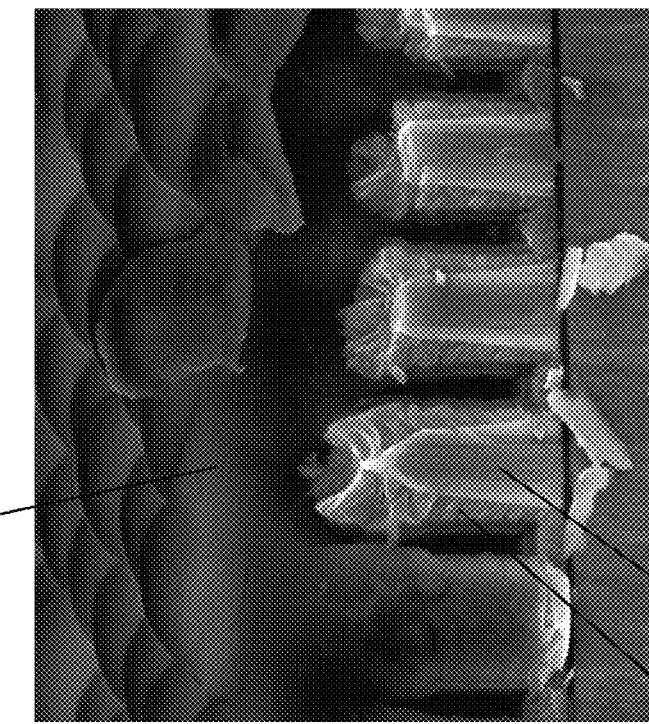
FIG. 5D is a cross-section SEM image of a nanowire LED device fabricated in accordance with FIGS. 5A-C.

A transparent conductive oxide (TCO) material layer 511, such as an ITO layer, may be deposited over the nanowire structure by any suitable method, e.g., sputter deposition, evaporation, etc., to make electrical contact with the outer shells 503 of the nanowires 501 and provide a p-electrode. Other suitable TCO materials, such as aluminium-doped zinc oxide (AZO), may be utilized for layer 511. A dielectric material layer 510 may then be deposited over the TCO material layer 511. In one embodiment, the dielectric material layer 510 may comprise $SiO_2$ that is deposited by chemical vapor deposition (CVD). In one example, CVD deposition of a dielectric material (e.g., $SiO_2$) layer 510 may be performed at elevated temperature (e.g., 200° C. to 600° C., preferably less than 510° C., including at about 350° C.) using gas flows of chemically active precursor(s) for the $SiO_2$, such as $SiH_4$ and $O_2$, at a sub-atmospheric pressure (e.g., 25 Torr or less, such as 280 mTorr). FIG. 5D is a SEM image showing a layer 510 of $SiO_2$ deposited via CVD over an ITO layer 511 and GaN nanowires 501 in one embodiment.

A p-side metal contact 513 may be formed in a p-side contact area 516 in contact with the TCO layer 511, as shown in FIG. 5A. An n-side metal contact 517 may be formed in an n-side contact area 515 and in contact with the n-type buffer layer 507, as shown in FIG. 5B.

The n-side contact area 515 may be formed by removing a portion the nanowires 501, such as by etching through a mask or by laser ablation, to expose the n-type buffer layer 507 in the future n-metal contact site (e.g., the lower right corner of the device 500 in FIG. 5C). The p-side and n-side metal contacts 513, 517 may be formed using standard photolithography to deposit a mask (e.g., resist) that covers all features except for the n and p contact areas 515, 516. The exposed n and p contact areas 515, 516 may be wet or dry etched to expose the n-GaN buffer layer 507 and TCO layer 511, respectively. Metal contacts may then be formed over the exposed n-GaN layer 507 and TCO layer 511 in the n and p contact areas 515, 516. An exemplary metal contact 513, 517 may comprise an Al/Ti/Au stack, with Al in contact with either the n-GaN (n-contact) or TCO (p-contact). The photoresist mask with metal may then be lifted off the substrate to provide the device 500 of FIGS. 5A-C.

The formation of one or both metal contacts 513, 517 may be performed either before or after the dielectric material 510 is deposited over the nanowire array. Thus, in embodiments where the dielectric material 510 is deposited before the formation of the metal contact(s) 513, 517, the dielectric material 510 may be removed from the n and/or p contact areas 515, 516 by laser ablation, etching through a patterned mask, etc., prior to the formation of the metal contact(s) 513, 517 as described above. In embodiments where the dielectric material 510 is deposited after the metal contact(s) 517 are formed, the dielectric material 510 may be deposited over the entire device, and a portion of the dielectric material 510 may be removed (e.g., via etching) to expose the metal contact(s) 513, 517.

The addition of a dielectric material layer 510 over the transparent conductive oxide (TCO) layer 511 may significantly decrease the resistivity of the TCO layer 511, thus minimizing or eliminating current crowding and improving the light extraction efficiency of the device 500. This is illustrated in FIG. 5E, which is a photograph of an LED device 500 as shown in FIGS. 5A-B. The device 500 of FIG. 5D includes a dielectric ($SiO_2$) layer 510 formed by CVD over an ITO electrode layer but is otherwise equivalent to the prior art device 400 of FIG. 4D. The measured sheet resistance of the ITO layer in the device 500 of FIG. 5D is ~44Ω, compared to a measured ITO layer sheet resistance of ~241Ω in the device 400 of FIG. 4D. Thus, the addition of the CVD $SiO_2$ layer 510 results the resistivity of the ITO layer decreasing to approximately 18% of the value without a dielectric layer (i.e., measured resistivity of ~44Ω in device 500 with CVD $SiO_2$ layer is ~18% of measured resistivity of ~241Ω in the equivalent device 400 of FIG. 4D without the CVD $SiO_2$ layer). In various embodiments, the addition of a dielectric material layer 510 over a transparent conductive material electrode layer 511 in an LED device as described above may decrease the resistivity of the electrode layer 511 to a value that is 50% or less (e.g., 10 to 50%) of the resistivity of the electrode layer 511 in the LED device without the dielectric material layer 510. Equivalently, the addition of the dielectric material layer 510 may be said to decrease the resistivity of the electrode layer 511 by at least 50% compared to the resistivity of the electrode layer 511 in the LED device without the dielectric material layer 510. Preferably, the sheet resistance of the ITO layer is less than 100Ω, such as 30-100Ω.

Further, as shown in FIG. 5E, the device 500 emits substantially the same amount or more of light over the entire light emitting surface of the device (e.g., an amount of light emitted proximate to the n-side metal contact 517 is within about 25%, such as within about 15%, for example within 1-15% as an amount of light emitted proximate to the p-side metal contact 513). Thus, the current crowding effect of the device 400 of FIG. 4D may be minimized or eliminated by the addition of the dielectric material layer 510 as described above.

In other embodiments, the dielectric layer 510 may be $SiO_2$ deposited (e.g., via CVD) using a tetraethyl orthosilicate ($Si(OC_2H_5)_4$, or TEOS) precursor, such as using gas flows of TEOS and $O_2$ and/or TEOS and $O_3$. In further embodiments, the dielectric layer 510 may comprise SiN, and may be deposited (e.g., via CVD) using suitable chemically active precursors, such as gas flows of dichlorosilane ($H_2SiCl_2$) and ammonia ($NH_3$). In further embodiments, the dielectric layer 510 may comprise $Al_2O_3$, and may be deposited (e.g., via CVD) using suitable chemically active precursors, such as $AlCl_3$, trimethylaluminum (TMA), aluminum alkoxides (e.g., $Al(O-i-Pr)_3$), aluminum acetylacetonate, $CO_2/H_2$, $O_2$, $N_2O$ and/or $H_2O$.

Without wishing to be bound by any particular theory, it is believed that the addition of the dielectric film (e.g., CVD $SiO_2$) may decrease the resistivity of the transparent conductive oxide (e.g., ITO) film by optimizing the concentration of oxygen vacancies in the ITO film. Oxygen vacancies contribute to the concentration of charge carriers in ITO. A higher concentration of charge carriers can lead to a lower resistivity of ITO. Other mechanisms may also be operative in reducing the resistivity of the ITO film.

It has further been discovered that a similar reduction in the resistivity of the TCO layer 511 does not result when a dielectric material is deposited on the TCO layer 511 using a physical deposition process, such as evaporation. In one example, $TiO_2$ deposited by evaporation at ~100° C. over the ITO electrode in a GaN nanowire LED device did not result in a measured decrease in ITO resistivity. Without wishing to be bound by any particular theory, it is believed that one or more of CVD deposition of the dielectric material, elevated temperature (e.g., 200° C. to 600° C.) during the deposition of the dielectric material and/or the presence of one or more chemically active precursors for the dielectric (e.g., $SiH_4$, $O_2$, dichlorosilane, TEOS, etc.) at sufficient partial pressure contributes to the observed reduction in resistivity of the TCO layer.

Although the present invention is described in terms of nanowire LEDs, it should be appreciated that other nanowire based semiconductor devices, such as field effect transistors, diodes and, in particular, devices involving light absorption or light generation, such as, photodetectors, solar cells, lasers, etc., can be implemented on any nanowire structures. Further, the principles of the present invention may be utilized in other LED devices, such as LED devices having a transparent conductive material layer over a non-planar surface.

For example, any nanowire or bulk semiconductor devices which utilize a transparent, electrically conductive material, such as a transparent, conductive metal oxide (TCO), for example ITO, may include the layer of the dielectric material which reduces the resistance or resistivity of the transparent, electrically conductive material. For example, the device may comprise a solar cell which uses a TCO electrode, or a display device, such as a liquid crystal display device, which uses a TCO electrode (e.g., as a transparent electrode of a TFT active matrix device or as a counter electrode).

All publications and patents cited in this specification are herein incorporated by reference as if each individual publication or patent were specifically and individually indicated to be incorporated by reference and are incorporated herein by reference to disclose and describe the methods and/or materials in connection with which the publications are cited. The citation of any publication is for its disclosure prior to the filing date and should not be construed as an admission that the present invention is not entitled to antedate such publication by virtue of prior invention. Further, the dates of publication provided may be different from the actual publication dates which may need to be independently confirmed.

The foregoing method descriptions are provided merely as illustrative examples and are not intended to require or imply that the steps of the various embodiments must be performed in the order presented. As will be appreciated by one of skill in the art the order of steps in the foregoing embodiments may be performed in any order. Words such as "thereafter," "then," "next," etc. are not necessarily intended to limit the order of the steps; these words may be used to guide the reader through the description of the methods. Further, any reference to claim elements in the singular, for example, using the articles "a," "an" or "the" is not to be construed as limiting the element to the singular.

The preceding description of the disclosed aspects is provided to enable any person skilled in the art to make or use the present invention. Various modifications to these aspects will be readily apparent to those skilled in the art, and the generic principles defined herein may be applied to other aspects without departing from the scope of the invention. Thus, the present invention is not intended to be limited to the aspects shown herein but is to be accorded the widest scope consistent with the principles and novel features disclosed herein.

What is claimed is:

1. A method of fabricating a light emitting diode (LED) device, comprising:
    forming a layer of a transparent, electrically conductive material over at least a portion of a non-planar surface of the LED device;
    depositing a layer of a dielectric material over, and directly on a top surface of at least a portion of the layer of the transparent, electrically conductive material, wherein the layer of the dielectric material has a transmissivity greater than 85% for at least one emission wavelength of the LED device; and
    forming a metal contact directly on a top surface of the layer of the transparent, electrically conductive material layer, wherein the metal contact physically contacts a portion of a top surface of the layer of the dielectric material,
    wherein depositing the layer of dielectric material comprises at least one of:
    (a) depositing the layer using a chemical vapor deposition (CVD) process;
    (b) depositing the layer at a temperature of 200° C. or more; and
    (c) depositing the layer using one or more chemically active precursors for the dielectric material,
    wherein the dielectric material layer decreases a resistivity of the layer of transparent, electrically conductive material to a value that is 50% or less than the resistivity of the layer of transparent, electrically conductive material in the device without the dielectric material layer.

2. The method of claim 1, wherein depositing the layer of dielectric material comprises depositing the layer at a temperature of 200° C. to 600° C.

3. The method of claim 1, further comprising:
    forming a plurality of first conductivity type semiconductor nanowire cores located over a support; and
    forming a plurality of second conductivity type semiconductor shells extending over and around the respective nanowire cores to form the LED device having a non-planar surface, wherein the layer of transparent conductive material is formed over the plurality of second conductivity type semiconductor shells.

4. The method of claim 1, wherein the layer of transparent, electrically conductive material comprises a transparent conductive oxide (TCO).

5. The method of claim 1, wherein the dielectric material comprises at least one of $SiO_2$, SiN and $Al_2O_3$.

6. The method of claim 1, wherein the layer of the dielectric material has an optical transmissivity greater than 90% for at least one emission wavelength of the LED device.

7. The method of claim 1, wherein depositing the layer of dielectric material comprises at least two of:
    (a) depositing the layer using the chemical vapor deposition (CVD) process;
    (b) depositing the layer at the temperature of 200° C. or more; and
    (c) depositing the layer using one or more chemically active precursors for the dielectric material.

8. The method of claim 1, wherein depositing the layer of dielectric material comprises all three of:
    (a) depositing the layer using the chemical vapor deposition (CVD) process;
    (b) depositing the layer at the temperature of 200° C. or more; and
    (c) depositing the layer using one or more chemically active precursors for the dielectric material.

9. A method of fabricating a semiconductor device, comprising:
    forming a layer of a transparent, electrically conductive material over at least a portion of the semiconductor device;
    depositing a layer of a dielectric material over, and directly on a top surface of at least a portion of the layer of the transparent, electrically conductive material, wherein the layer of the dielectric material has a transmissivity greater than 85% for at least one emission wavelength of the LED device; and
    forming a metal contact directly on a top surface of the layer of the transparent, electrically conductive material layer, wherein the metal contact physically contacts a portion of a top surface of the layer of the dielectric material,
    wherein depositing the layer of dielectric material comprises at least one of:
    (a) depositing the layer using a chemical vapor deposition (CVD) process;
    (b) depositing the layer at a temperature of 200° C. or more; and
    (c) depositing the layer using one or more chemically active precursors for the dielectric material; and
    wherein the dielectric material decreases a resistivity of the transparent, electrically conductive material to a value that is 50% or less of the resistivity of the transparent, electrically conductive material in the device without the dielectric material layer.

10. The method of claim 9, wherein the layer of the dielectric material comprises a single $SiO_2$ layer which contacts the layer of transparent conductive material and the metal contact physically contacts the portion of the top surface of the single $SiO_2$ layer.

11. The method of claim 10, wherein the dielectric material decreases the resistivity of the transparent, electrically conductive material by optimizing a concentration of vacancies in the transparent, electrically conductive material.

12. The method of claim 1, wherein the layer of the dielectric material comprises a single $SiO_2$ layer which contacts the layer of transparent conductive material and the metal contact physically contacts the portion of the top surface of the single $SiO_2$ layer.

13. The method of claim 12, wherein the dielectric material decreases the resistivity of the transparent, electrically conductive material by optimizing a concentration of vacancies in the transparent, electrically conductive material.

14. The method of claim 1, further comprising:
forming a photoresist layer directly on a top surface of the layer of the dielectric material;
forming an opening through the layer of the dielectric material and through the photoresist layer, wherein the top surface of the layer of the transparent, electrically conductive material layer is physically exposed at a bottom of the opening;
depositing a metal inside the opening and over the photoresist layer; and
lifting off the photoresist layer, wherein a remaining portion of the deposited metal constitutes the metal contact.

15. The method of claim 1, wherein:
the LED device is formed on a buffer layer on a semiconductor substrate; and
the LED device comprises a plurality of nanowires.

16. The method of claim 12, wherein:
the transparent, electrically conductive material comprises an indium tin oxide layer;
the single $SiO_2$ layer is deposited by the CVD process at a temperature of 200° C. to 600° C. using $SiH_4$ and $O_2$ chemically active precursors at a pressure of 25 Torr or less; and
the single $SiO_2$ layer decreases the resistivity of the indium tin oxide layer by optimizing a concentration of vacancies in the indium tin oxide layer.

17. The method of claim 1, wherein:
the metal contact is formed after formation of the layer of the dielectric material; and
a portion of the dielectric material is removed to form the opening within the layer of the dielectric material; and
the metal contact is deposited directly on the entire sidewall of the opening within the layer of the dielectric material.

18. The method of claim 9, further comprising:
forming a photoresist layer directly on a top surface of the layer of the dielectric material;
forming an opening through the layer of the dielectric material and through the photoresist layer, wherein the top surface of the layer of the transparent, electrically conductive material layer is physically exposed at a bottom of the opening;
depositing a metal inside the opening and over the photoresist layer; and
lifting off the photoresist layer, wherein a remaining portion of the deposited metal constitutes the metal contact.

19. The method of claim 9, wherein:
the LED device is formed on a buffer layer on a semiconductor substrate; and
the LED device comprises a plurality of nanowires.

20. The method of claim 10, wherein:
the transparent, electrically conductive material comprises an indium tin oxide layer;
the single $SiO_2$ layer is deposited by the CVD process at a temperature of 200° C. to 600° C. using $SiH_4$ and $O_2$ chemically active precursors at a pressure of 25 Torr or less; and
the single $SiO_2$ layer decreases the resistivity of the indium tin oxide layer by optimizing a concentration of vacancies in the indium tin oxide layer.

21. The method of claim 9, wherein:
the metal contact is formed after formation of the layer of the dielectric material; and
a portion of the dielectric material is removed to form the opening within the layer of the dielectric material; and
the metal contact is deposited directly on the entire sidewall of the opening within the layer of the dielectric material.

* * * * *